(12) United States Patent
Yang et al.

(10) Patent No.: US 11,930,715 B2
(45) Date of Patent: *Mar. 12, 2024

(54) HIGHLY PHYSICAL ETCH RESISTIVE PHOTORESIST MASK TO DEFINE LARGE HEIGHT SUB 30NM VIA AND METAL HARD MASK FOR MRAM DEVICES

(71) Applicant: TAIWAN SEMICONDUCTOR MANUFACTURING COMPANY, LTD., HsinChu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 577 days.

This patent is subject to a terminal disclaimer.

(21) Appl. No.: 17/140,790

(22) Filed: Jan. 4, 2021

(65) Prior Publication Data

US 2021/0151668 A1  May 20, 2021

Related U.S. Application Data

(63) Continuation of application No. 16/133,955, filed on Sep. 18, 2018, now Pat. No. 10,886,461.

(51) Int. Cl.
*H10N 50/01* (2023.01)
*H10N 50/10* (2023.01)
*H10N 50/80* (2023.01)

(52) U.S. Cl.
CPC ............ *H10N 50/01* (2023.02); *H10N 50/10* (2023.02); *H10N 50/80* (2023.02)

(58) Field of Classification Search
CPC ........ H10N 50/01; H10N 50/10; H10N 50/80; H01L 21/0274; H01L 21/0337;
(Continued)

(56) References Cited

U.S. PATENT DOCUMENTS

| 8,313,959 B1 | 12/2012 | Huang et al. |
| 8,324,698 B2 | 12/2012 | Zhong et al. |

(Continued)

FOREIGN PATENT DOCUMENTS

| CN | 102142399 A | 8/2011 |
| CN | 107437581 A | 12/2017 |

(Continued)

*Primary Examiner* — Mohammad A Rahman
(74) *Attorney, Agent, or Firm* — HAYNES AND BOONE, LLP

(57) ABSTRACT

A conductive via layer is deposited on a bottom electrode, then patterned and trimmed to form a sub 20 nm conductive via on the bottom electrode. The conductive via is encapsulated with a first dielectric layer, which is planarized to expose a top surface of the conductive via. A MTJ stack is deposited on the encapsulated conductive via wherein the MTJ stack comprises at least a pinned layer, a barrier layer, and a free layer. A top electrode layer is deposited on the MTJ stack and patterned and trimmed to form a sub 30 nm hard mask. The MTJ stack is etched using the hard mask to form an MTJ device and over etched into the encapsulation layer but not into the bottom electrode wherein metal re-deposition material is formed on sidewalls of the encapsulation layer underlying the MTJ device and not on sidewalls of a barrier layer of the MTJ device.

20 Claims, 2 Drawing Sheets

(58) Field of Classification Search
CPC ........... H01L 21/3065; H01L 21/31144; H01L 43/08; G11C 2211/5615; G11C 11/161; G01R 33/098; G11B 5/3909
See application file for complete search history.

(56) References Cited

U.S. PATENT DOCUMENTS

| | | |
|---|---|---|
| 9,502,640 B1 | 11/2016 | Annunziata et al. |
| 10,069,064 B1 | 9/2018 | Haq et al. |
| 10,388,862 B1 | 8/2019 | Yang et al. |
| 10,522,753 B2 * | 12/2019 | Yang .................. H10N 50/80 |
| 2010/0102404 A1 * | 4/2010 | Li ...................... H10N 50/01 |
| | | 257/E29.323 |
| 2011/0189796 A1 | 8/2011 | Lu et al. |
| 2012/0326250 A1 | 12/2012 | Gaidis et al. |
| 2017/0098759 A1 * | 4/2017 | Oh .................... H10N 50/80 |
| 2017/0125668 A1 | 5/2017 | Paranjpe et al. |
| 2018/0040668 A1 | 2/2018 | Park et al. |
| 2019/0280197 A1 | 9/2019 | Wang et al. |
| 2020/0091419 A1 | 3/2020 | Yang et al. |
| 2020/0136031 A1 | 4/2020 | Yang et al. |

FOREIGN PATENT DOCUMENTS

| | | |
|---|---|---|
| TW | 201709573 A | 3/2017 |
| TW | 202023049 A | 6/2020 |

* cited by examiner

HIGHLY PHYSICAL ETCH RESISTIVE PHOTORESIST MASK TO DEFINE LARGE HEIGHT SUB 30NM VIA AND METAL HARD MASK FOR MRAM DEVICES

PRIORITY DATA

The present application is a continuation application of U.S. patent application Ser. No. 16/133,955, filed Sep. 18, 2018, which is herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE), or their combination are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance.

To solve this issue, pure physical etching techniques such as ion beam etching (IBE) have been applied to etch the MTJ stack. However, due to the non-volatile nature, IBE etched conductive materials in the MTJ and bottom electrode can be re-deposited into the tunnel barrier, resulting in shorted devices. One approach to solve this issue is to greatly etch the MTJ so that the re-deposition can be confined below the tunnel barrier, without creating a shorting path. However two prerequisites have to be fulfilled to perform it. The first prerequisite is that the MTJ has to be built on top of large height vias that are thinner than the MTJ so that an adequate over etch does not induce re-deposition from the bottom electrode, which is usually wider than the MTJ. The second is that the metal hard mask, which also serves as the MTJ's top electrode, has to be thick enough so that enough remains after it is greatly consumed by the non-selective physical over etch. These considerations challenge the photolithography process since very thick photoresist is required for both cases, the patterns of which can easily collapse, especially when the size goes down to sub 30 nm. A new approach is needed to fully utilize the benefits of this technique.

Several references teach over etching to form MTJ's, including U.S. Patent Applications 2018/0040668 (Park et al) and 2017/0125668 (Paranipe et al). Other references teach thin vias on wider metal layers, such as U.S. Pat. No. 8,324,698 (Zhong et al). All of these references are different from the present disclosure.

SUMMARY

It is an object of the present disclosure to provide an improved method of forming MTJ structures.

Yet another object of the present disclosure is to provide a method of forming MTJ devices using a physical over etch to avoid both chemical damage and physical shorts.

A further object of the present disclosure is to provide a method of forming MTJ devices using a physical over etch into a dielectric layer encapsulating a metal via on a bottom electrode to avoid both chemical damage and physical shorts.

In accordance with the objectives of the present disclosure, a method for etching a magnetic tunneling junction (MTJ) structure is achieved. A conductive via layer is deposited on a bottom electrode, then patterned and trimmed to form a sub 20 nm conductive via on the bottom electrode. The conductive via is encapsulated with a first dielectric layer, which is planarized to expose a top surface of the conductive via. A MTJ stack is deposited on the encapsulated conductive via wherein the MTJ stack comprises at least a pinned layer, a barrier layer on the pinned layer, and a free layer on the barrier layer. A top electrode layer is deposited on the MTJ stack. The top electrode layer is patterned and trimmed to form a sub 30 nm hard mask. The MTJ stack is etched using the hard mask to form an MTJ device and over etched into the encapsulation layer but not into the bottom electrode wherein metal re-deposition material is formed on sidewalls of the encapsulation layer underlying the MTJ device and not on sidewalls of a barrier layer of the MTJ device.

BRIEF DESCRIPTION OF THE DRAWINGS

In the accompanying drawings forming a material part of this description, there is shown.

DETAILED DESCRIPTION

In the process of the present disclosure, we have demonstrated that due to the ultra-high selectivity between photoresist and metal under physical etch, one can simply use a photoresist mask alone to define a sub 30 nm metal via and hard mask with height larger than 100 nm. These will greatly increase the process margin when an MTJ over etch is required to reduce the metal re-deposition and associated electrically shorted devices.

In a typical process, photoresist is used to define dielectric or dielectric/metal hybrid hard masks by chemical RIE, before etching the metal vias underneath. Chemical plasma species which etch the hard mask quickly but consume photoresist slowly can be used at this first step. Then, the metal via is defined using other chemical plasma species which etch the metal quickly but consume the hard mask slowly. By doing this, a larger height of metal vias can be obtained than by using photoresist alone. However, the photoresist is always consumed quickly under chemical RIE, no matter what chemistry is used, thus limiting the height of the metal via to lower than 50 nm when the pillar size goes down to ~30 nm or below.

In the process of the present disclosure, the dielectric hard mask is not required because the photoresist is consumed very slowly due to photoresist's slow etch rate under physical etching. Using a photoresist mask alone, we apply a physical etch such as pure Ar RIE or IBE to pattern the vias and hard mask metals due to its better selectivity than a regular chemical RIE. Later, assisted by high angle IBE trimming, sub 20 nm vias and sub 30 nm metal hard masks with height larger than 100 nm are fabricated, making it possible to greatly over etch sub 30 nm MTJ's without chemical damage and re-deposition on the tunnel barrier.

Figure 1:
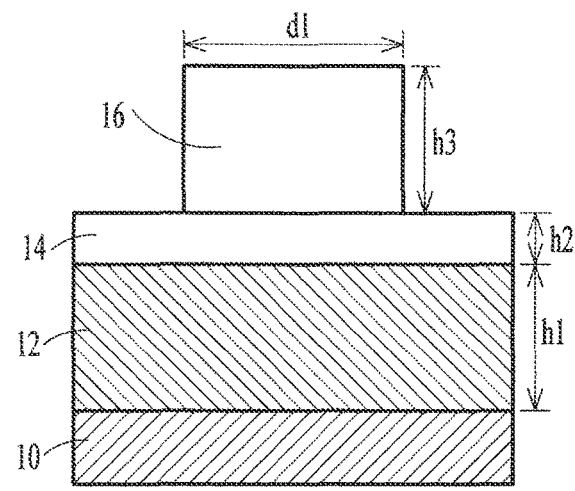
FIGS. 1 through 8 illustrate in cross-sectional representation steps in a preferred embodiment of the present disclosure.

Referring now to FIGS. 1 through 8, the novel method of the present disclosure will be described in detail. Referring now more particularly to FIG. 1, there is shown a bottom electrode 10 formed on a substrate, not shown. Now, a metal layer 12 for forming a via, such as Ta, TaN, Ti, TiN, W, Cu, Mg, Ru, Cr, Co, Fe, Ni, Pt, Ir, Mo, or their combinations such as TiN/Co/Ir, TiN/TiN/Ir, etc. with thickness h1 of 80-150 nm, and preferably ≥100 nm, is deposited onto the bottom electrode 10, which may be made of similar materials. An organic or dielectric anti-reflective coating 14 such as SiN, SiON, or SiCOH with thickness h2 of ≥20 nm is then deposited on the metal layer 12. Preferably a dielectric anti-reflective coating is used since it reduces light reflection more effectively. Moreover, the dielectric anti-reflective coating can act a hard mask for etching, so no additional hard mask is required. Photoresist is spin-coated and patterned by 248 nm photolithography, forming patterns 16 with size d1 of ~70-80 nm and height h3 of ≥200 nm.

Figure 2:
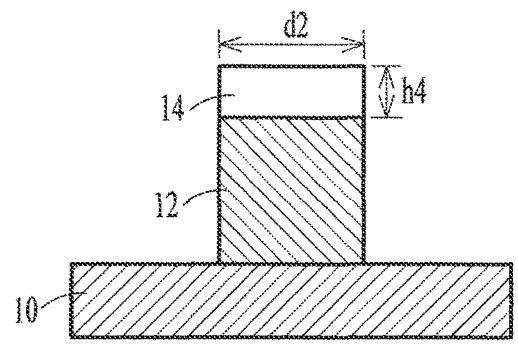

The anti-reflective coating 14 and metal layer 12 are etched by a physical etch such as pure Ar RIE or IBE, as shown in FIG. 2. As illustrated in Table 1 below, if Ta is used for the via material, the etch rate ratio of photoresist to Ta is 1.6:1, smaller than that of 2.4:1 when $CF_4$ RIE is used. When the metal material is TiN, the etch rate ratio of photoresist to TiN is 1.7:1, much smaller than that of 4.5:1 using the same $CF_4$ RIE.

TABLE 1

Selectivity comparison between $CF_4$ RIE and Ar RIE/IBE.

| Plasma species | Selectivity (Etch rate of PR:Ta) | Selectivity (Etch rate of PR:TiN) |
|---|---|---|
| $CF_4$ | 2.4:1 | 4.5:1 |
| Ar | 1.6:1 | 1.7:1 |

In both cases, these relatively slow etch rates of photoresist compared to metals allow for the fabrication of metal pillars with height ≥100 nm and size d2 of ~50-100 nm. The etch rate of photoresist is at most twice the etch rate of the underlying metal. Depending on the thickness of the metal 12, the anti-reflective coating 14 can be partially consumed. An anti-reflective coating height h4 of ≥15 nm remains.

Figure 3:
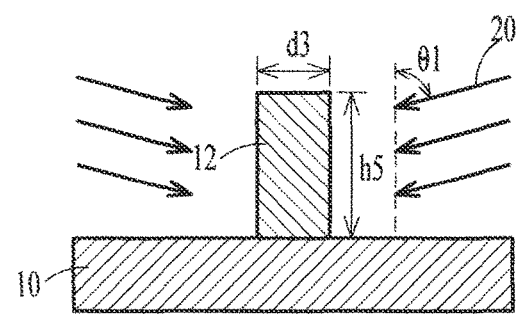

Now, a high angle IBE trimming 20 with an angle θ1 ranging from 70-90º with respect to the surface's normal line is applied to the metal pillar. The metal patterns shrink horizontally. The resulting via size d3 ranges from 10-20 nm, depending on the IBE trimming conditions such as RF power (500-1000 W) and time (100-1000 sec). Here, ex-situ IBE trimming is used when the metal vias are made of inert metals and in-situ IBE trimming is needed for metals that can be readily oxidized in air. Due to the protection of the remaining dielectric 14 on top and the extremely low vertical etch rate (≤5 Å/sec) of IBE at such a large angle, the remaining via's height h5 is the same as the as-deposited height h1 or decreases less than 5 nm after this step, as shown in FIG. 3.

Figure 4:
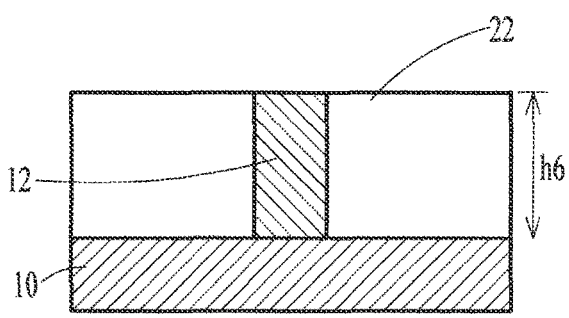
Figure 5:
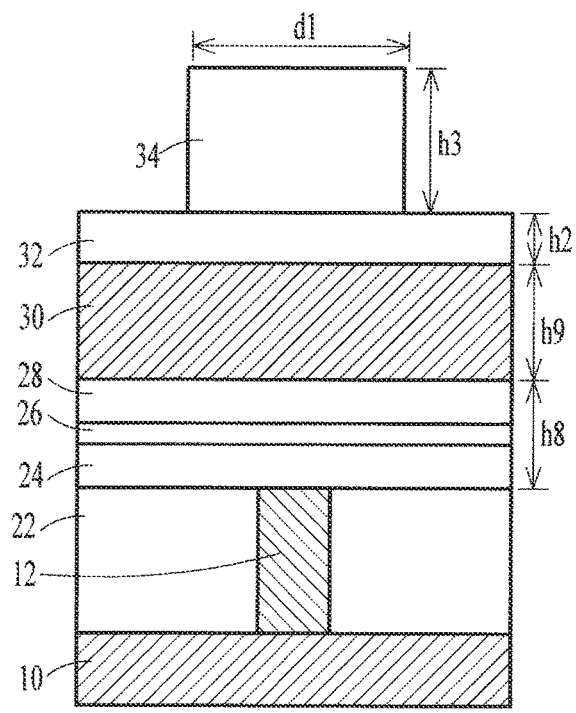

Next, referring to FIG. 4, a dielectric material 22 such as $SiO_2$, SiN, SiON, SiC, or SiCN with thickness ≥100 nm is deposited to encapsulate the vias 12. Here, ex-situ encapsulation is used when the metal vias are made of inert metals and in-situ encapsulation is needed for metals that can be readily oxidized in air. Chemical mechanical polishing (CMP) is applied to smooth the surface as well as to expose the metal vias underneath, with remaining via height h6 of ≥80 nm. One should note that these dielectric surrounded small size vias make the later MTJ over etch possible without etching the bottom electrode.

Now, layers are deposited on encapsulated vias to form magnetic tunnel junctions. For example, pinned layer 24, tunnel barrier layer 26, and free layer 28 are deposited. There may be one or more pinned, barrier, and/or free layers. The MTJ layers have a height h8 of 10-30 nm. A top electrode 30 made of similar material to the vias with thickness h9 of ≥100 nm is deposited on the MTJ layers. A second anti-reflective coating 32 is deposited on the top electrode 20 followed by photoresist coating, exposure, and development to form photoresist patterns 34 with size d1 of ~70-80 nm and height h3 of ≥200 nm.

Figure 6:
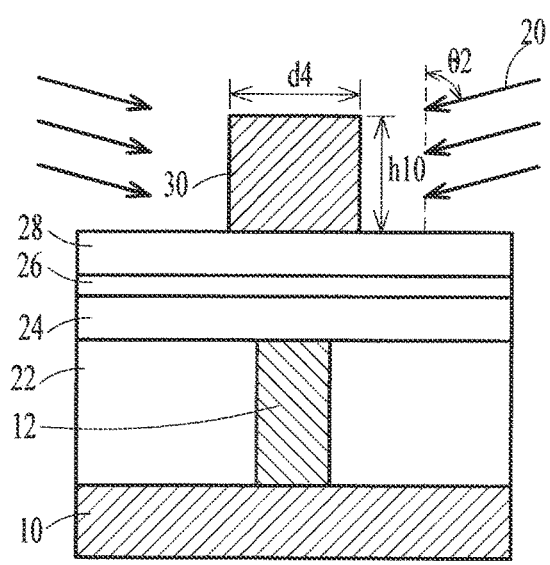

The top electrode 30 is physically etched and IBE trimmed, as shown in FIG. 6. The hard mask etch and trim can use the same conditions such as gas species/RF and bias powers/angles as the earlier metal via etch. However, it should be noted that in order to trim or optimize the hard mask's roughness to improve the uniformity of feature size and device performance, one can use different etch conditions. The resulting metal hard mask/top electrode 30 has a size d4 of ~30 nm and height h10 of ≥100 nm.

Figure 7:
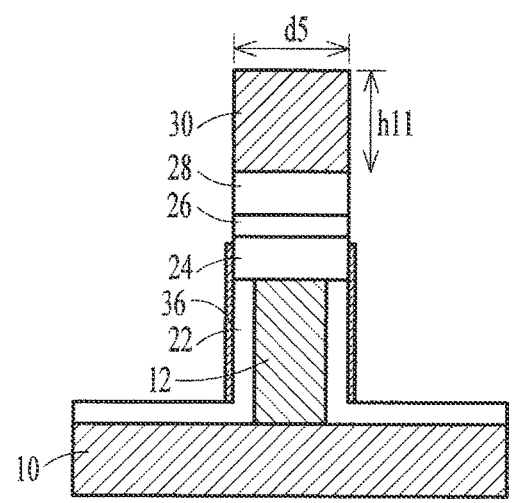

Now, the MTJ stack 24/26/28 can be etched by the same type of physical etch as the hard mask with the same or different etch conditions. The MTJ stack can also be etched by chemical RIE or a combination of physical RIE, IBE and chemical RIE. After a great physical over etch of the MTJ, far into the dielectric encapsulation layer 22, but not all the way down to the underlying bottom electrode 10, all the metal re-deposition 36 is confined below the tunnel barrier layer 26. Furthermore, there is no metal re-deposition from the bottom electrode 10 as it remains covered by the dielectric encapsulation 22, as shown in FIG. 7. Also, the sub 20 nm vias 12 underneath the MTJ stacks are not etched since the via width is smaller than the MTJ width. Importantly, the remaining metal hard mask 30 has a remaining height h11 of larger than 50 nm. This leaves enough process margin for the following steps.

Figure 8:
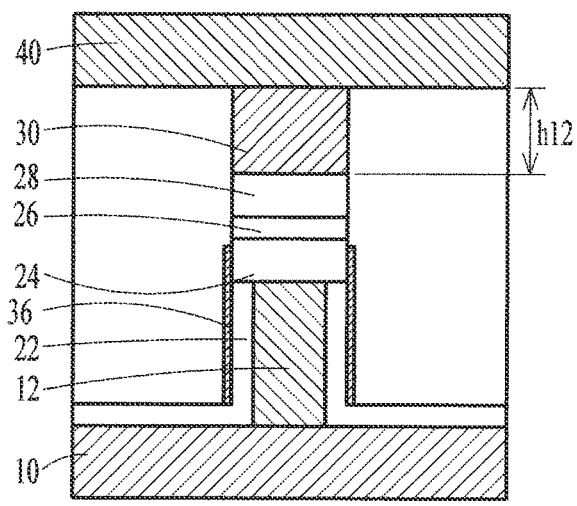

As shown in FIG. 8, a second dielectric layer 38 is deposited to encapsulate the vias 12, MTJ structure 24/26/28, and top electrode 30. CMP and surface sputtering are applied to smooth the surface as well as to expose the top electrode followed by top metal deposition 40.

In summary, the process of the present disclosure uses a photoresist mask alone to physically etch the via and hard mask metals below and above the MTJ. Due to better selectivity of this type of etch as compared with a regular RIE etch, we can achieve sub 60 nm metal hard mask and vias with height larger than 100 nm. Later, assisted by high angle IBE trimming, we can decrease the feature size to sub 30 nm, without significantly reducing the via height. This will greatly increase the process margin as well as reduce the metal re-deposition through an MTJ over etch. It should be noted that this is a low cost technique, since we achieve this without involving expensive immersion 193 nm or EUV photolithography or a complex hard mask stack. The process of the present disclosure will be used for MRAM chips of the size smaller than 60 nm as problems associated with chemically damaged sidewall and re-deposition from bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
    forming a conductive via on a bottom electrode;
    encapsulating the conductive via with a first dielectric layer;
    forming a stack of magnetic tunneling junction (MTJ) layers on the conductive via;
    forming a top electrode on the stack of MTJ layers; and
    patterning the stack of MTJ layers and the first dielectric layer using the top electrode as a mask such that metal re-deposition material is formed on sidewalls of the patterned first dielectric layer, wherein the metal re-deposition material is prevented from interfacing with the conductive via by the patterned first dielectric layer being disposed on sidewalls of the conductive via.

2. The method of claim 1, wherein forming of the stack of MTJ layers on the conductive via includes:
    forming a pinned layer on the conductive via;
    forming a tunnel barrier layer on the pinned layer; and
    forming a free layer on the tunnel barrier layer.

3. The method of claim 2, wherein the metal re-deposition material is further formed on sidewalls of the free layer.

4. The method of claim 1, wherein forming of the conductive via includes:
    forming a conductive layer on the bottom electrode;
    forming a first antireflective coating layer on the conductive layer;
    patterning the conductive layer to form the conductive via, wherein the first antireflective coating layer is removed during the patterning of the conductive layer to form the conductive via.

5. The method of claim 4, wherein patterning of the conductive layer to form the conductive via includes performing a reactive ion etching process.

6. The method of claim 1, wherein forming of the top electrode on the stack of MTJ layers includes:
    forming a conductive layer on the stack of MTJ layers;
    patterning the conductive layer to form the top electrode on the stack of MTJ layers.

7. The method of claim 1, further comprising forming a second dielectric layer directly on the metal re-deposition material, a portion of the stack of MTJ layers and the top electrode.

8. The method of claim 7, further comprising forming a top metal layer directly on the top electrode and the second dielectric layer.

9. A method comprising:
    forming a conductive via on a bottom electrode;
    forming a first dielectric layer around the conductive via;
    forming a pinned layer on the conductive via;
    forming a tunnel barrier layer on the pinned layer;
    forming a top electrode on the tunnel barrier layer; and
    etching the tunnel barrier layer, the pinned layer and the first dielectric layer such that conductive re-deposition material is formed on sidewalls of the etched first dielectric layer and the etched pinned layer; and
    forming a second dielectric layer directly on the conductive re-deposition material.

10. The method of claim 9, further comprising forming a free layer on the tunnel barrier layer; and
    wherein the etching of the tunnel barrier layer, the pinned layer and the first dielectric layer further include etching the free layer.

11. The method of claim 10, wherein the etching of the free layer, the tunnel barrier layer, the pinned layer and the first dielectric layer forms conductive re-deposition material on sidewalls of the etched first dielectric layer and the etched pinned layer while sidewalls of the etched tunnel barrier layer and the etched free layer are free of the conductive re-deposition material.

12. The method of claim 9, wherein the etching of the tunnel barrier layer, the pinned layer and the first dielectric layer includes an etching process selected from the group consisting of a physical reactive ion etching process, a chemical reactive ion etching process, a physical ion beam etching process and a chemical ion beam etching process.

13. The method of claim 9, wherein forming of the second dielectric layer directly on the conductive re-deposition material further includes forming the second dielectric layer directly on the etched tunnel barrier layer and the top electrode.

14. The method of claim 9, wherein forming of the conductive via on the bottom electrode includes:
    forming a conductive layer on the bottom electrode;
    performing a first etching process on the conductive layer to thereby form a patterned conductive layer; and
    performing a second etching process on the patterned conductive layer to thereby form the conductive via, the second etching process being different than the first etching process.

15. A method comprising:
    forming a metal layer on a bottom electrode;
    forming a first antireflective coating layer on the metal layer;
    forming a patterned first resist layer on the first antireflective coating layer;
    patterning the first antireflective coating layer and the metal layer by using the patterned
    trimming the patterned metal layer to form a metal via;
    forming a first dielectric layer around the metal via;
    forming a pinned layer on the metal via;
    forming a tunnel barrier layer on the pinned layer;
    forming a top electrode on the tunnel barrier layer;
    patterning the tunnel barrier layer, the pinned layer and the first dielectric layer while using the top electrode as mask, wherein patterning of the tunnel barrier layer, the pinned layer and the first dielectric layer forms metal re-deposition material on the patterned first dielectric layer; and
    forming a second dielectric layer directly on the metal re-deposition material.

16. The method of claim 15, wherein patterning of the first antireflective coating layer and the metal layer by using the patterned first resist layer as the mask includes physically etching the first anti-reflective coating and the metal layer by an etching process selected from the group consisting of an ion beam etching process and a reactive ion etching process.

17. The method of claim 15, wherein trimming of the patterned metal layer to form the metal via includes performing an ion beam etching at an angle ranging from about 70° to about 90° with respect to a normal line of a top surface of the patterned metal layer.

18. The method of claim 15, wherein forming of the top electrode on the tunnel barrier layer includes:
    forming a conductive layer on the tunnel barrier layer;
    forming a second antireflective layer on the conductive layer;
    forming a patterned second resist layer on the second antireflective layer;
    patterning the second antireflective coating layer and the conductive layer by using the patterned second resist layer as a mask;

trimming the patterned conductive layer to form the top electrode.

19. The method of claim 15, wherein the first antireflective coating layer includes an organic material.

20. The method of claim 15, wherein the metal layer has a first thickness, and wherein the metal via has the first thickness after the trimming of the patterned metal layer to form the metal via.

* * * * *